United States Patent
Yang et al.

(10) Patent No.: US 9,349,702 B2
(45) Date of Patent: May 24, 2016

(54) CHIP BONDING METHOD AND DRIVING CHIP OF DISPLAY

(71) Applicant: CHUNGHWA PICTURE TUBES, LTD., Taoyuan County (TW)

(72) Inventors: Ching-Ying Yang, Taoyuan County (TW); Yuan-Mo Li, Taoyuan County (TW)

(73) Assignee: CHUNGHWA PICTURE TUBES, LTD., Taoyuan County (TW)

( * ) Notice: Subject to any disclaimer, the term of this patent is extended or adjusted under 35 U.S.C. 154(b) by 0 days.

(21) Appl. No.: 14/557,776

(22) Filed: Dec. 2, 2014

(65) Prior Publication Data

US 2016/0086906 A1 Mar. 24, 2016

(30) Foreign Application Priority Data

Sep. 19, 2014 (TW) .............................. 103132476 A

(51) Int. Cl.
*H01L 23/34* (2006.01)
*H01L 23/00* (2006.01)
*H01L 21/66* (2006.01)
*H01L 23/498* (2006.01)

(52) U.S. Cl.
CPC ................ *H01L 24/17* (2013.01); *H01L 22/10* (2013.01); *H01L 23/49816* (2013.01); *H01L 24/81* (2013.01)

(58) Field of Classification Search
CPC ......... H01L 24/17; H01L 24/81; H01L 22/10; H01L 23/49816
USPC .......................................................... 257/723
See application file for complete search history.

(56) References Cited

U.S. PATENT DOCUMENTS

| 5,462,217 A | * | 10/1995 | Simmons et al. | ......... 228/180.22 |
| 2005/0248031 A1 | * | 11/2005 | Johnson | ......................... 257/737 |
| 2006/0163724 A1 | * | 7/2006 | Hwang et al. | .................. 257/737 |

* cited by examiner

*Primary Examiner* — Phat X Cao
*Assistant Examiner* — Mohammad M Hoque
(74) *Attorney, Agent, or Firm* — McClure, Qualey & Rodack, LLP

(57) ABSTRACT

A chip bonding method for bonding a chip on a display panel is provided. The chip includes a joint face, a rear face, input bumps and output bumps. The joint face having a first symmetry axis line is opposite to the rear face. The input bumps and the output bumps are respectively located on two sides of the symmetry axis line and disposed on the joint face. The chip bonding method includes: calculating a first centroid collectively formed by contact faces of the input bumps and the output bumps, defining a straight line passing through the first centroid and parallel to the first symmetry axis line, and applying pressure on the rear face of the chip by a forcing face parallel to the joint face, wherein the forcing face has a second symmetry axis line aligned parallel to the straight line.

4 Claims, 3 Drawing Sheets

CHIP BONDING METHOD AND DRIVING CHIP OF DISPLAY

CROSS-REFERENCES TO RELATED APPLICATIONS

This non-provisional application claims priority under 35 U.S.C. §119(a) on Patent Application No. 103132476 filed in Taiwan, R.O.C. on 2014, Sep. 19, the entire contents of which is hereby incorporated by reference.

BACKGROUND

1. Technical Field

The present invention relates to a chip bonding method and a driving chip of display, and more particular to a driving chip in which the bonding stability thereof is improved and a chip bonding method in which the bonding stability between a display panel and a driving chip of the method is improved.

2. Related Art

Accompanying the development of display technologies, display devices are wildly used in commercial electronic device or computer device; liquid-crystal display and organic light emitting diode display (OLED display) technologies, are flourishing in particular. In order to make products thin and light, the chip on glass (COG) technique is applied to manufacturing the liquid-crystal display, thus reducing significantly the thickness of the liquid-crystal display. The chip on glass technique is described thus: after the driving chip is aligned with the contact pads on the glass substrate, a hot pressing procedure is applied to allow the driving chip to bond to the glass substrate via an anisotropic conductive film (ACF) so as to reduce the circuit board which is necessary in the traditional tape carrier package procedure. Consequently, the thickness and the weight of the display can be reduced, and the cost for manufacturing the display may also be reduced.

Since the display resolution requirements have become more and more important, and the display manufacturers tend to reduce costs as much as possible, the number of the driving chips for a single display must be reduced to achieve display cost reduction, thus increasing the number of bumps on a single driving chip.

Conventionally, in the driving chip package procedure (for example, in the COG procedure), the forcing center of the pressing head of the pressing fixture is aligned to the center of the driving chip to undergo the hot pressing operation, thereby allowing the bonding between the driving chip and the display panel via the anisotropic conductive film. However, in the following quality control procedures, it is realized that when the number of the bumps on the driving chip increases, the conductive particle indentations of the anisotropic conductive film will not be uniform; particularly, the indentations of the output side of the driving chip will be lighter than those of the input side of the driving chip (generally, the number of the bumps disposed at the output side of the driving chip is more than that of the bumps disposed at the input side of the driving chip). Consequently, the bonding stability between the bumps of the driving chip and the glass substrate is worse, thereby reducing the overall defect-free rate of the products and affecting the quality of the product.

SUMMARY

In view of this, the present invention provides a chip bonding method provided for bonding a chip to a display panel. The chip includes a joint face, a rear face, a plurality of input bumps and a plurality of output bumps. The joint face is opposite to the rear face and has a first symmetry axis line. The input bumps are disposed on the joint face and located at one of two sides of the first symmetry axis line. The output bumps are disposed on the joint face and located at the other side of the first symmetry axis line. The chip bonding method includes calculating a first centroid collectively formed by input contact faces of the input bumps, calculating a second centroid collectively formed by output contact faces of the output bumps, defining a straight line parallel to the first symmetry axis line of the joint face to satisfy the relation of $D2/D3=A_o/A_i$, wherein $D2$ is the distance from the first centroid to the straight line, $D3$ is the second centroid to the straight line, $A_o$ is the total area of the output contact faces of the output bumps, $A_i$ is the total area of the input contact faces of the input bumps, and applying pressure on the rear face of the chip via a forcing face, wherein the forcing face is parallel to the joint face and has at least one second symmetry axis line, and the at least one second symmetry axis line of the forcing face is aligned parallel to the straight line.

The present invention further provides another chip bonding method provided for bonding a chip to a display panel. The chip includes a joint face, a rear face, a plurality of input bumps and a plurality of output bumps. The joint face is opposite to the rear face and has a first symmetry axis line. The input bumps are disposed on the joint face and located at one of two sides of the first symmetry axis line. The output bumps are disposed on the joint face and located at the other side of the first symmetry axis line. The chip bonding method includes calculating a centroid collectively formed by input contact face of the input bumps and output contact faces of the output bumps, defining a straight line passing through the centroid and parallel to the first symmetry axis line of the joint face, and applying pressure on the rear face of the chip via a forcing face, wherein the forcing face is parallel to the joint face and has at least one second symmetry axis line, the at least one second symmetry axis line of the forcing face is aligned parallel to the straight line.

The present invention further provides a driving chip of display. The driving chip includes a joint face, a rear face, a plurality of input bumps and a plurality of output bumps. The joint face has a symmetry axis line and opposite to the rear face. The input bumps are disposed on the joint face and located at one of two sides of the symmetry axis line. The output bumps are disposed on the joint face and located at the other side of the symmetry axis line. The number of the output bumps is different from that the number of the input bumps. The joint-face symmetry axis line of the joint face satisfies the relation of $D2/D3=A_o/A_i$, wherein $D2$ is the distance from the first centroid to the joint-face symmetry axis line, $D3$ is the distance from the second centroid to the joint-face symmetry axis line, $A_o$ is the total area of the output contact faces of the output bumps, $A_i$ is the total area of the input contact faces of the input bumps.

In conclusion, with the application of the chip bonding method according to the present invention, the symmetry axis line of the pressing head of the pressing fixture is adjusted to align with the straight line passing through the centroid collectively formed by the input contact faces of the input bumps and the output contact faces of the output bumps, thereby allowing the pressure sustained by the input bumps being approximately equal to the pressure sustained by the output bumps so as to improve the problem about the non-uniformity of the conductive particle indentations sufficiently, thus improving the quality and the defect-free rate of the products. Alternatively, according to the driving chip of display of the present invention, the symmetry axis line of the pressing head of the pressing fixture is aligned with the symmetry axis line of the driving chip, thereby solving the problem that the conductive particle indentations of the anisotropic conductive film at the output side of the driving chip is non-uniform with respect to the input side of the driving chip; hence, the quality and the defect-free rate of the products can be improved.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
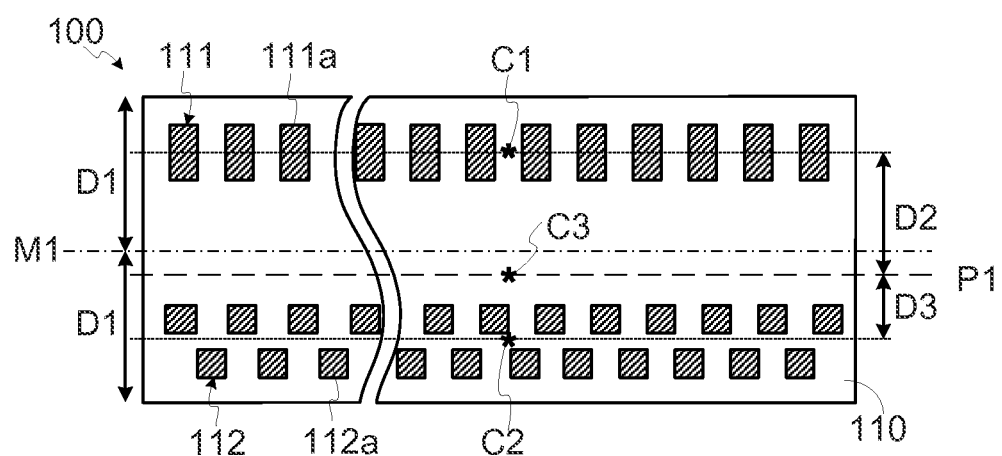
FIG. 1 is a top view of a driving chip according to the present invention.
Figure 2A:
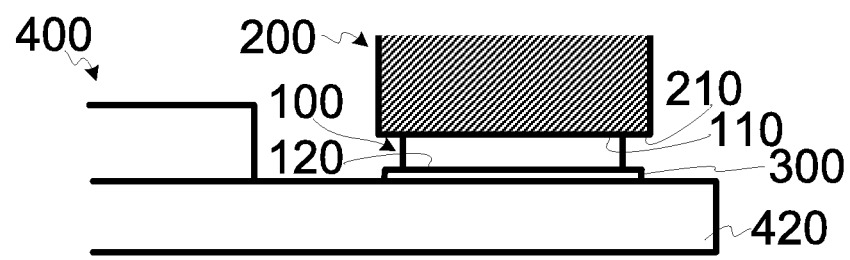
FIG. 2A is a cross-sectional view showing the driving chip according to the present invention in a hot pressing procedure.

Please refer to FIG. 1 and FIG. 2A, illustrating an exemplary embodiment of a driving chip 100 according to the present invention. FIG. 1 is a top view of the driving chip 100 according to the present invention, and FIG. 2A is a cross-sectional view showing the driving chip 100 according to the present invention implemented in a hot pressing procedure. The driving chip 100 includes a joint face 120, a rear face 110 opposite to the joint face 120, a plurality of input bumps 111 and a plurality of output bumps 112.

The joint face 120 of the driving chip 100 has a first symmetry axis line M1 divided the joint face 120 into two parts symmetrical with respect to each other. In this embodiment, the first symmetry axis line M1 is perpendicular to the two short sides of the driving chip 100 so as to divide the driving chip 100 into the two parts, and the distance D1 between the first symmetry axis line M1 and one of the two long sides of the driving chip 100 is equal to the distance D1 between the first symmetry axis line M1 and the other long side of the driving chip 100.

The driving chip 100 includes a plurality of bumps disposed thereon (based on the direction of the signal transmission, the bumps are classified into input bumps 111 and output bumps 112). The bumps are made of gold, but embodiments are not limited thereto. Each of the input bumps 111 has an input contact face 111a, and each of the output bumps 112 has an output contact face 112a. The input contact faces 111a and the output contact faces 112a are provided to electrically connect with other circuits (such as contact pads disposed on the glass substrate 420 of the display panel 400 for transmitting I/O signals of the driving chip 100). The input bumps 111 and the output bumps 112 are respectively disposed at two sides of the first symmetry axis line M1, where the two sides of the first symmetry axis line M1 are divided by the first symmetry axis line M1. The portion of the driving chip 100 where the input bumps 111 are disposed to is defined as an input side, and the portion of the driving chip 100 where the output bumps 112 are disposed to is defined as an output side.

In this embodiment, the input bumps 111 and the output bumps 112 of the driving chip 100 of the display are distantly aligned along the two long sides of the driving chip 100, respectively. Furthermore, the number of the output bumps 112 is more than that of the input bumps 111, and the number of the output bumps 112 is two times or more of that of the input bumps 111. Along with the increase of the resolution of the display, for example, from HD to full HD, or even to 2K/4K resolution, the difference between the number of the output bumps 112 and that of the input bumps 111 becomes larger and larger.

Figure 2B:
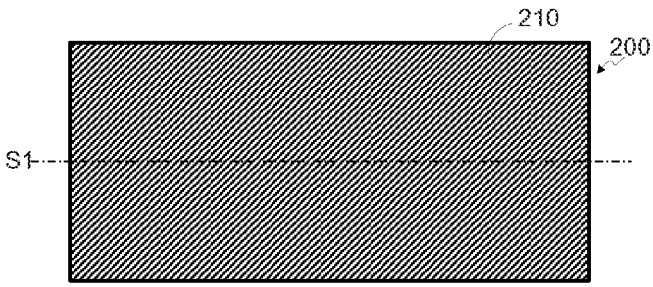
FIG. 2B is a top view showing a pressing head applied in the hot pressing procedure for pressing the chip according to the present invention.

Please refer to FIG. 1, FIG. 2A and FIG. 2B. Generally, when the driving chip 100 is bonding on the display panel 400 via the package process, the joint face 120 of the driving chip 100 is faced toward the glass substrate 420 of the display panel 400; the input bumps 111 and output bumps 112 are respectively aligned to the contact pads of the glass substrate 420 of the display panel 400, and an anisotropic conductive film 300 is disposed between the joint face 120 of the driving chip 100 and the display panel 400; hence, by the pressure applied to the rear face 110 of the driving chip 100, the input bumps 111 and the output bumps 112 are bonding on the contact pads of the glass substrate 420 of the display panel 400 via the anisotropic conductive film 300.

In the conventional pressing procedure of driving chip of display, the driving chip 100 is pressed by a pressing head with a forcing face 210 upon pressing. The forcing face 210 has at least one second symmetry axis line S1. Conventionally, the second symmetry axis line S1 of the forcing face 210 is aligned to the first symmetry axis line M1 of the driving chip 100 for pressing the driving chip 100; however, since the number of the input bumps 111 are different from that of the output bumps 112, the magnitude of the force applied to the input bumps 111 is different from that of the force applied to the output bumps 112 so as to influence the quality of the products.

Figure 3:
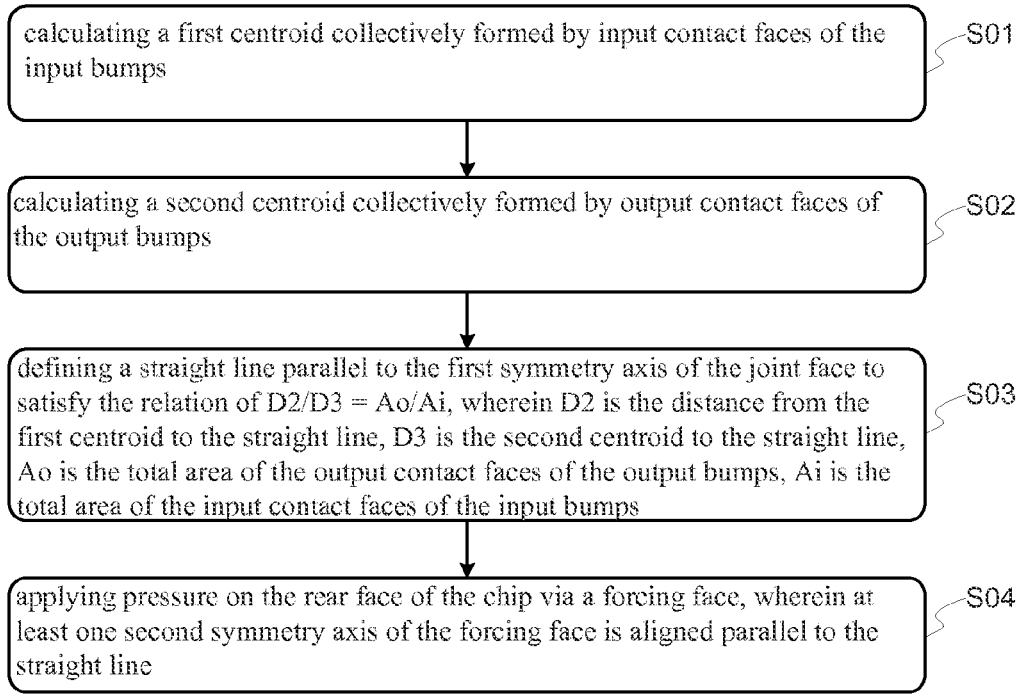
FIG. 3 is a flow chart showing a chip bonding method according to the present invention.
Figure 4:
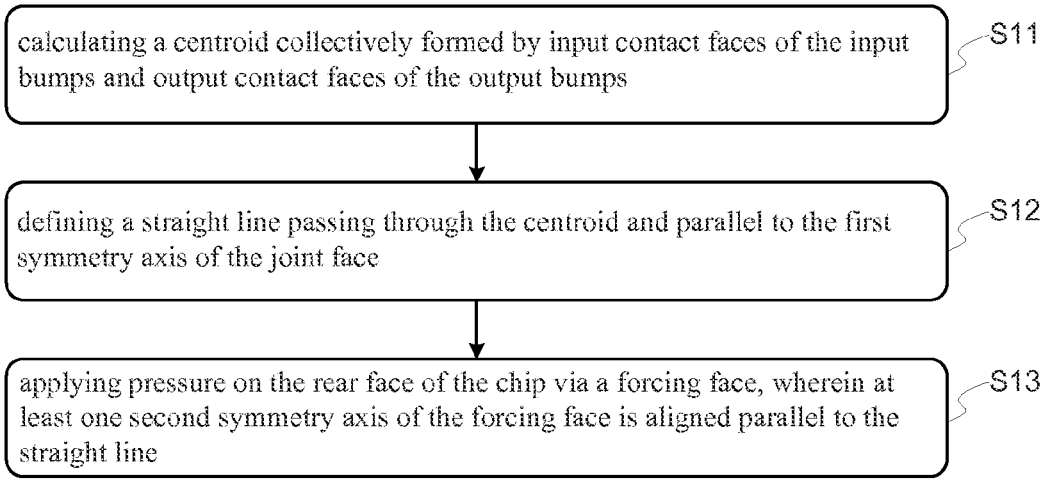
FIG. 4 is a flow chart showing another chip bonding method according to the present invention.

Please refer to FIG. 1 to FIG. 3, in which a chip bonding method is provided and applicable to bonding the driving chip 100 on the display panel 400; furthermore, the chip bonding method according to the present invention does not lead the force applied to the input bumps 111 and the output bumps 112 of the driving chip 100 being non-uniform. The chip bonding method includes following steps.

Step S01: calculating a first centroid C1 collectively formed by the input contact faces 111a of the input bumps 111.

In this step, the position of the first centroid C1 collectively formed by the input contact faces 111a of the input bumps 111 is obtained by using the physical equation for centroid calculation.

Step S02: calculating a second centroid C2 collectively formed by the output contact faces 112a of the output bumps 112.

In this step, the position of the second centroid C2 collectively formed by the output contact faces 112a of the output bumps 112 is obtained by using the physical equation for centroid calculation.

Step S03: defining a straight line P1 parallel to the first symmetry axis line M1 of the joint face 120, wherein the ratio of the distance D2 from the first centroid C1 to the straight line P1 to the distance D3 from the second centroid C2 to the straight line P1, equals to, the ratio of the total area of the output contact faces 112a of the output bumps 112 to the total area of the input contact faces 111a of the input bumps 111.

In this step, the straight line P1 parallel to the first symmetry axis line M1 of the joint face 120 is defined by the aforementioned relationship. This relationship can be presented as $D_2/D_3=A_o/A_i$. $A_o$ is the total area of the output contact faces 112a of the output bumps 112, and $A_i$ is the total area of the input contact faces 111a of the input bumps 111.

Step S04: applying pressure on the rear face 110 of the driving chip 100 via the forcing face 210, wherein the at least one second symmetry axis line S1 of the forcing face 210 is aligned parallel to the straight line P1.

In this step, the at least one second symmetry axis line S1 of the forcing face 210 (for example, the surface of the pressing head 200 of the pressing fixture which contacts with the driving chip 100), is aligned parallel to the straight line P1 defined in Step S03; consequently, the rear face 110 of the driving chip 100 is pressed by the forcing face 210 so as to be forced uniformly to the driving chip 100 so as to allow the driving chip 100 to bond to the glass substrate 420 of the display panel 400 via the anisotropic conductive film 300.

In all embodiments within the present invention, description about the second symmetry axis line S1 is aligned parallel to the straight line P1 means, a face collectively defined by the second symmetry axis line S1 and the straight line P1 before pressing is perpendicular to the joint face 120 of the driving chip 100. Moreover, in the present invention, the pressing head 200 of the conventional pressing fixture is provided for pressing the driving chip 100, thus the forcing face 210 of the pressing head 200 is the face contacted with the driving chip 100.

Please refer to FIG. 1, FIG. 2A, FIG. 2B and FIG. 4, in which another chip bonding method is provided and applicable to bonding the driving chip 100 on the glass substrate 420 of the display panel 400. The chip bonding method includes following steps.

Step S11: calculating a centroid collectively formed by the input contact faces 111a of the input bumps 111 and the output contact faces 112a of the output bumps 112.

In the aforementioned chip bonding method, the first centroid C1 collectively formed by the input contact faces 111a of the input bumps 111 and the second centroid C2 collectively formed by the output contact faces 112a of the output bumps 112 are individually calculated; here, a third centroid C3 collectively formed by the input contact faces 111a of the input bumps 111 and the output contact faces 112a of the output bumps 112 is calculated so as to obtain the position of the third centroid C3.

Step S12: defining a straight line P1 passing through the third centroid C3 collectively formed by the input contact faces 111a of the input bumps 111 and the output contact faces 112a of the output bumps 112, wherein the straight line P1 is parallel to the first symmetry axis line M1 of the joint face 120.

In the aforementioned chip bonding method, the straight line P1 is defined by setting the ratio of the distance from the first centroid C1 to the straight line P1 to the distance from the second centroid C2 to the straight line P1 being equal to the ratio of the total area of the output contact faces 112a of the output bumps 112 to the total area of the input contact faces 111a of the input bumps 111 (namely, the description about $D_2/D_3=A_o/A_i$); here, the straight line P1 is directly defined as a line passing through the third centroid C3 and parallel to the first symmetry axis line M1 of the joint face 120.

Step S13: applying pressure on the rear face 110 of the driving chip 100 via the forcing face 210, wherein the at least one second symmetry axis line S1 of the forcing face 210 is aligned parallel to the straight line P1.

In this step, by adjusting the at least one second symmetry axis line S1 of the forcing face 210 to be aligned parallel to the straight line P1 defined in Step S12; consequently, the rear face 110 of the driving chip 100 is pressed by the forcing face 210 so as to be forced uniformly to the driving chip 100 to allow the driving chip 100 to bond to the glass substrate 420 of the display panel 400 via the anisotropic conductive film 300.

Based on this, when the chip package procedure is implemented according to the chip bonding method of the present invention, only the at least one second symmetry axis line S1 of the forcing face 210 needs to be adjusted to parallel aligned with the straight line P1, and the adjusted forcing face 210 applies pressure to the driving chip 100 so as to allow the pressure sustained by the input bumps 111 being approximately equal to the pressure sustained by the output bumps 112, thereby improving the problem of the non-uniformity of the conductive particle indentations of the anisotropic conductive film 300. Additionally, for the driving chip 100 manufactured by implementing the chip bonding method of the present invention, the conductive particles (the conductive particles of the anisotropic conductive film 300), on each bump can be at least equal to or more than five, thereby improving the quality of the products.

Figure 5:
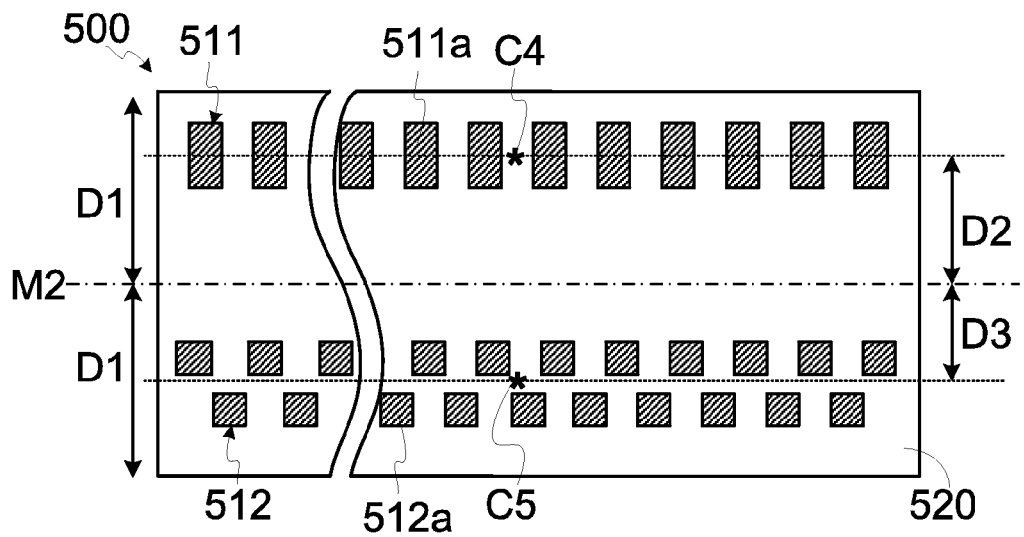
FIG. 5 is a schematic view showing the configuration of bumps of a driving chip of display according to the present invention.

Please refer to FIG. 2A, FIG. 2B and FIG. 5, in which a driving chip 500 of display is illustrated. The layout of the input bumps and the output bumps are different from those of the conventional driving chips. The driving chip 500 according to the present invention includes a joint face 520, a rear face 110 opposite to the joint face 520 (shown in FIG. 2A), a plurality of input bumps 511 and a plurality of output bumps 512. The previously mentioned chip bonding methods according to the present invention are suitable for conventional driving chips; by altering the pressing technique, the problem about the non-uniformity of the conductive particle indentations can be sufficiently improved. The driving chip 500 described hereinafter is based on the same invention concept; by altering the layout of the input bumps 511 and the output bumps 512, the driving chip 500 is applicable for conventional pressing procedure of driving chip of display without resulting in the problem about the non-uniformity of the conductive particle indentations. The details are described as following.

The joint face 520 of the driving chip 500 has a joint-face symmetry axis line M2 divided the joint face 52 into two parts symmetrical with respect to each other. In this embodiment, the joint-face symmetry axis line M2 is perpendicular to the two short sides of the driving chip 500 so as to divide the driving chip 500 into two parts, and the distance D1 between the joint-face symmetry axis line M2 and one of the two long sides of the driving chip 500 is equal to the distance D1 between the joint-face symmetry axis line M2 and the other long side of the driving chip 500. The input bumps 511 and the output bumps 512 are respectively disposed at two sides of the joint-face symmetry axis line M2, where the two sides of the joint-face symmetry axis line M2 are divided by the joint-face symmetry axis line M2. However, embodiments are not thus limited by the figures illustrated in FIG. 5; in some implementation aspects, the joint-face symmetry axis line M2 is perpendicular to the two long sides of the driving chip 500 so as to divide the driving chip 500 into two parts symmetrical with respect to each other, and the input bumps 511 and the output bumps 512 are respectively disposed at two sides of the joint-face symmetry axis line M2, where the two sides of the joint-face symmetry axis line M2 are divided by the joint-face symmetry axis line M2.

The driving chip 500 includes a plurality of bumps disposed thereon (based on the direction of the signal transmission, the bumps are classified into input bumps 511 and output bumps 512). The bumps are made of gold, but embodiments are not limited thereto. Each of the input bumps 511 has an input contact face 511a, and each of the output bumps 512 has an output contact face 512a. The input contact faces 511a and the output contact faces 512a are provided to electrically connect with other circuits (such as contact pads (not shown) disposed on the glass substrate 420 of the display panel 400 for transmitting I/O signals of the driving chip 500). The input bumps 511 and the output bumps 512 are respectively disposed at the two sides of the joint-face symmetry axis line M2, where the two sides of the joint-face symmetry axis line M2 are divided by the joint-face symmetry axis line M2. The portion of the driving chip 500 where the input bumps 511 are disposed is defined as an input side, and the portion of the driving chip 500 where the output bumps 512 are disposed is defined as an output side.

In this embodiment, the number of the output bumps 512 is more than that of the input bumps 511; particularly, the number of the output bumps 512 is approximately equal to or more than two times the number of the input bumps 511. Upon applying the conventional pressing procedure to the driving chip 500 according to the present invention, when the number of the output bumps 512 is less than two times the number of the input bumps 511, although the forcing face 210 of the pressing head 200 would still apply pressure on the driving chip 500 in an non-uniform manner, such non-uniformity does not lead to obvious manufacturing defect.

In this embodiment, the distance between a fourth centroid C4 and the joint-face symmetry axis line M2 is D2, in which the fourth centroid C4 is collectively formed by the input contact faces 511a of the input bumps 511 of the driving chip 500 of the display; the distance between a fifth centroid C5 and the joint-face symmetry axis line M2 is D3, in which the fifth centroid C5 is collectively formed by the output contact faces 512a of the output bumps 512.

In order to improve the non-uniformity of the pressure applied to the driving chip in conventional package procedure, the equation $D2/D3=A_o/A_i$ must be satisfied. $A_o$ is the total area of the output contact faces 512a of the output bumps 512, and $A_i$ is the total area of the input contact faces 511a of the input bumps 511.

Based on this, according to the driving chip 500 of the present invention, the layout of the input bumps 511 or that of the output bumps 512 can be altered to adjust the distance between the fourth centroid C4 and the joint-face symmetry axis line M2 and the distance between the fifth centroid C5 and the joint-face symmetry axis line M2 to meet the previously mentioned equation. Hence, the conventional package procedure can be directly applied to the driving chip 500 of the present invention; during the pressing, the at least one second symmetry axis line S1 of the forcing face 210 is adjusted to parallel align with the joint-face symmetry axis line M2, and the adjusted forcing face 210 applies pressure to the driving chip 500 so as to allow the pressure sustained by the input bumps 511 being approximately equal to the pressure sustained by the output bumps 512, thereby improving the problem of the non-uniformity of the conductive particle indentations of the anisotropic conductive film 300.

Accordingly, with the application of the chip bonding method according to the present invention, the problem about the non-uniformity of the conductive particle indentations can be sufficiently improved, thereby improving the quality and the defect-free rate of the products. Alternatively, according to the driving chip of display of the present invention in which the layout of the bumps of the driving chip is altered, pressure sustained by the input bumps is able to be approximately equal to the pressure sustained by the output bumps, thus further improving the problem of the non-uniformity of the conductive particle indentations of the anisotropic conductive film; hence, the quality and the defect-free rate of the products can be improved.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A chip bonding method, provided for bonding a chip to a display panel, the chip comprising a joint face, a rear face, a plurality of input bumps and a plurality of output bumps, the joint face being opposite to the rear face and having a first symmetry axis line, the input bumps disposed on the joint face and located at one of two sides of the first symmetry axis line, the output bumps disposed on the joint face and located at the other side of the first symmetry axis line, the chip bonding method comprising:
    calculating a first centroid collectively formed by input contact faces of the input bumps;
    calculating a second centroid collectively formed by output contact faces of the output bumps;
    defining a straight line parallel to the first symmetry axis line of the joint face to satisfy the relation of $D2/D3=Ao/Ai$, wherein D2 is the distance from the first centroid to the straight line, D3 is the second centroid to the straight line, Ao is the total area of the output contact faces of the output bumps, Ai is the total area of the input contact faces of the input bumps; and
    applying pressure on the rear face of the chip via a forcing face, wherein the forcing face is parallel to the joint face and has at least one second symmetry axis line, the at least one second symmetry axis line of the forcing face is aligned parallel to the straight line.

2. The chip bonding method according to claim 1, further comprising:
    calculating a third centroid collectively formed by input contact faces of the input bumps and the output bumps to define the straight line, wherein the straight line passes through the third centroid.

3. The chip bonding method according to claim 1, further comprising:
    disposing an anisotropic conductive film between the joint face of the chip and the display panel.

4. The chip bonding method according to claim 1, further comprising:
    aligning the input bumps and the output bumps of the chip to contact pads of the display panel, respectively.

* * * * *